United States Patent [19]

Marshall

[11] Patent Number: 4,928,023

[45] Date of Patent: May 22, 1990

[54] IMPROVED OUTPUT BUFFER HAVING REDUCED NOISE CHARACTERISTICS

[75] Inventor: Steven P. Marshall, Missouri City, Tex.

[73] Assignee: Texas Instruments Incorporated, Dallas, Tex.

[21] Appl. No.: 90,076

[22] Filed: Aug. 27, 1987

[51] Int. Cl.$^5$ .................. H03K 17/16; H03K 19/003; H03K 5/12

[52] U.S. Cl. .................................... 307/443; 307/451; 307/579; 307/270; 307/263

[58] Field of Search .............. 307/443, 451, 475, 548, 307/270, 263, 579, 585, 264

[56] References Cited

U.S. PATENT DOCUMENTS 4,395,644 7/1983 Misaizu ................ 307/270
4,731,553 3/1988 Van Lehn et al. .......... 307/443

*Primary Examiner*—Stanley D. Miller
*Assistant Examiner*—Timothy P. Callahan

*Attorney, Agent, or Firm*—Robby T. Holland; James T. Comfort; Melvin Sharp

[57] ABSTRACT

A CMOS push-pull output buffer is disclosed, which utilizes two reference nodes in the pull-down side. A first of the reference nodes is dedicated to switching the output from a high to a low logic state. A switching circuit is provided for driving the pull-down transistor associated with the first reference node responsive to the input node transition, but which turns off this pull-down transistor responsive to the output node approaching its final voltage. The second reference node is dedicated for holding the output node low in the DC state. A drive circuit is provided for driving the pull-down transistor associated with this second reference node, but which does not turn on this pull-down transistor until the output node has approached its final voltage, preferably when the first pull-down transistor is turned off. By controlling the turning on of the second pull-down transistor responsive to the output voltage, the coupling of noise from the first reference node to the second reference node can be minimized.

17 Claims, 2 Drawing Sheets

IMPROVED OUTPUT BUFFER HAVING REDUCED NOISE CHARACTERISTICS

This invention is in the field of integrated circuits, and is specifically directed to output buffers having reduced noise characteristics.

BACKGROUND OF THE INVENTION

Integrated circuits which perform arithmetic and logic functions, such as VLSI microprocessors, microcomputers, memories, and application-specific integrated circuits (ASICs), generally output the results of such functions as digital signals. The desired output waveform for such signals is a rapid and noiseless transition from a low voltage representing a "0" logic state to a higher voltage representing a "1" logic state, and vice versa. However, as the speed of the transition is increased by increasing the drive capability of the output buffer circuits, parasitic inductance associated with the interconnection of the output of the integrated circuit to other circuits, and to the power supplies powering the integrated circuit, generates increased noise in the system. This often forces the circuit designer to make a trade-off between the switching speed of the output buffers of the integrated circuit versus the level of noise generated by the switching of the output buffers.

In addition, as the technology for the manufacture of such integrated circuits has advanced, the number of parallel bits of information processed by such circuits has also increased. In the microcomputer field, advancing technology has allowed the advance from four-bit microcontrollers to thirty-two bit microcomputers. Accordingly, since the number of parallel bits output by such devices has increased, the number of output buffers has similarly increased, thereby increasing the noise generated during an output transition.

Furthermore, the increase in the number of parallel output buffers in an integrated circuit further provides for output-to-output sensitivities which are also aggravated by the number of outputs and the increased switching speed. For example, in a microcomputer having sixteen output buffers sharing the same power supply nodes, if fifteen of the outputs are to switch from a "1" state to a "0" state while the sixteenth is to remain at a "0" state, the noise generated by the fifteen switching output buffers will tend to couple, via the shared reference supply node, to the sixteenth output buffer. If the switching speed is sufficient to generate a large amount of noise, the data state presented by the sixteenth output buffer will be disturbed.

Prior techniques have utilized the separation of power supply nodes for output buffers into "quiet" and "noisy" power supply nodes. The push-pull output buffer circuit described in "A LAN System Interface Chip with Selectable Bus Protocols", by Donald Walters, Jr. et al. in 1985 Digest of Technical Papers, 1985 IEEE International Solid-State Circuits Conference (IEEE, 1985), pp. 190–191, shows separate nodes used for the ground reference in the output buffer, with a first ("noisy") ground node used in conjunction with a large pull-down transistor for rapid switching, and a second ("quiet") ground node used in conjunction with a smaller pull-down transistor for DC holding of the low output level. The push-pull output buffer circuit described in copending U.S. application Ser. No. 913,783 filed September 30, 1986 by David Van Lehn and Edward Flaherty, and assigned to Texas Instruments Incorporated, separates both the ground reference nodes and the positive $V_{dd}$ supply nodes, and accordingly has two pull-up and two pull-down transistors therein. In both of these circuits, means are provided for turning off the drive transistor driving from the "noisy" supply or reference node, once the output has approached its final state. The enabling of the drive transistors from the "quiet" nodes is delayed either by a delay stage, or by making the "quiet" drive transistor significantly smaller than the noisy "drive" transistor. However, during such time as both the "quiet" and "noisy" drive transistors are enabled, noise may couple from the "noisy" node to the "quiet" node.

It is an object of this invention to provide an improved output buffer circuit having separated noisy and quiet reference nodes, where the transistor driving the output from the quiet node is not enabled until the output transition is substantially complete.

It is a further object of this invention to provide such an improved circuit, where feedback from the output node controls the transistor driving from the quiet node.

Other objects and advantages of the instant invention will become apparent to those of ordinary skill in the art having reference to the following specification, in conjunction with the accompanying drawings.

SUMMARY OF THE INVENTION

The invention may be incorporated into an output buffer circuit which provides two reference supply nodes. A first one of the reference supply nodes is connected to a large pull-down transistor which has its gate driven from the data input, and which has a feedback circuit which turns the transistor off once the circuit output approaches the reference supply voltage. The second reference supply is connected to a second, smaller, pull-down transistor, which has its gate driven by the data input and gated by feedback from the circuit output. The second pull-down transistor is not enabled until the circuit output substantially reaches the reference supply voltage, minimizing the coupling of noise from the first reference supply node to the second reference supply node. A plurality of such output buffer circuits may be used on a single integrated circuit, with the first and second reference supply nodes shared thereamong.

DETAILED DESCRIPTION OF THE PREFERRED EMBODIMENT

Figure 1:
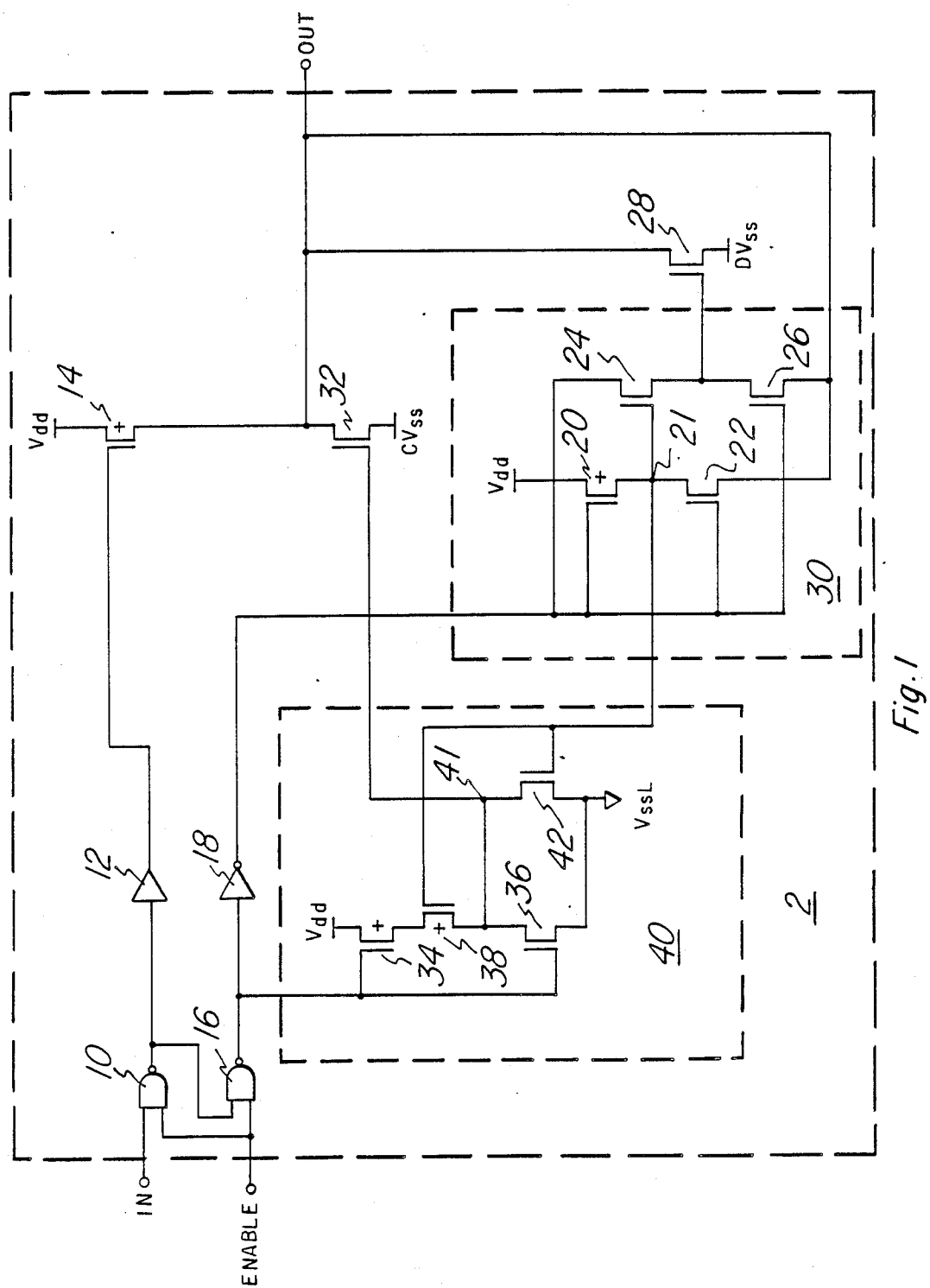
FIG. 1 is an electrical diagram, in schematic form, of an output buffer circuit constructed according to the invention.

Referring to FIG. 1, an output buffer 2 constructed according to the invention will be described. Output buffer 2 is a non-inverting output buffer, however, the invention described herein is of course equally applicable and useful to an inverting output buffer. NAND gate 10 in output buffer 2 receives a data signal at line IN, and an enable signal at line ENABLE. The output of NAND gate 10 is therefore unconditionally high with line ENABLE being low (indicating that output buffer 2 is to be disabled) and will be the logical complement of the logic state of line IN when line ENABLE is at a high logic level (indicating that output buffer 2 is to be enabled). The output of NAND gate 10 is communicated, via non-inverting buffer 12, to the gate of p-channel pull-up transistor 14, having its source-to-drain path connected between power supply node $V_{dd}$ and the output of output buffer 2 at line OUT. Accordingly, when line ENABLE is low, p-channel transistor 14 will be turned off regardless of the state of data line IN. With line ENABLE high, a low data state on line IN will turn off transistor 14 (the output of NAND gate 10 being high responsive to the low data state of line IN). With lines ENABLE and IN both at a high logic level, however, the output of NAND gate 10 will be at a low logic level. Buffer 12 will thus drive a low logic level at the gate of transistor 14, turning transistor 14 on, and driving line OUT from power supply node $V_{dd}$ to present a high logic level thereupon. The use of a p-channel transistor as pull-up transistor 14 allows the full $V_{dd}$ supply node voltage to appear at line OUT. It should be noted that some load capacitance will appear at line OUT from its connection to external devices; such load capacitance will be charged and discharged by output buffer 2, and will be taken advantage of by output buffer 2 in the high-to-low transition.

The output of NAND gate 10 is also connected to one input of NAND gate 16, NAND gate 16 receiving line ENABLE at its other input. Similarly as NAND gate 10, when line ENABLE is at a logic low level the output of NAND gate 16 will be unconditionally high. When line ENABLE is at a logic high (indicating output buffer 2 enabled), the output of NAND gate 16 will be the logical complement of the output of NAND gate 10; the output of NAND gate 10 when line ENABLE is high is the logical complement of the state of line IN, so the logic state at the output of NAND gate 16 will correspond to the logic state of line IN when output buffer 2 is enabled.

The output of NAND gate 16 is connected, via inverter 18, to switching circuit 30, which controls the gate of n-channel pull-down transistor 28. Transistor 28 has its drain connected to output line OUT, and has its source connected to reference node $DV_{ss}$, which is the "noisy" $V_{ss}$ node in output buffer 2. Transistor 28 is a relatively large transistor, having a relative channel width/length ratio (such as 1500), and thereby having a large gain and rapid switching characteristics. Transistor 28 is therefore utilized in this embodiment to switch line OUT from a high to a low logic level responsive to line IN switching from a high to a low logic level.

Switching circuit 30 is constructed so that the gate of transistor 28 is quickly driven with a logic high level (turning on transistor 28) responsive to a high to low transition of line IN, and so that transistor 28 is turned off (and held off) responsive to line OUT being near and at a low logic level. Switching circuit 30 includes a CMOS inverter made up of p-channel transistor 20 and n-channel transistor 22, both having their gates connected to the output of inverter 18. The source of transistor 20 is biased by the $V_{dd}$ supply, and the source of transistor 22 is connected to line OUT. The drains of transistors 20 and 22 are connected together, and are connected to the gate of an n-channel transistor 24, which has its source-to-drain path connected between the output of inverter 18 and the gate of transistor 28. Switching circuit 30 further includes n-channel transistor 26 which has its gate connected to the output of inverter 18, and which has its source-to-drain path connected between line OUT and the gate of transistor 28.

Output buffer 2 of FIG. 1 further includes n-channel pull-down transistor 32, which has its source connected to reference node $CV_{ss}$, and which has its drain connected to line OUT. Transistor 32 is a smaller transistor, relative to transistor 28 (having a W/L ratio of 75, for example), and accordingly will not have the gain of transistor 28. However, the purpose of transistor 32, as will be seen more clearly below, will be to hold line OUT at a low logic level after such time as transistor 28 has substantially discharged line OUT. The gate of transistor 32 is driven by drive circuit 40.

Reference node $CV_{ss}$ is at ground potential, similarly as node $DV_{ss}$, but node $CV_{ss}$ is electrically isolated from node $DV_{ss}$ to such an extent that noise appearing on node $DV_{ss}$ does not directly appear on node $CV_{ss}$ (except as may occur through output buffer 2, in the event that both transistors 32 and 28 are on at the same time). This isolation may preferably be done by way of having separate external pins for reference node $DV_{ss}$ and $CV_{ss}$, with no connection between reference nodes $DV_{ss}$ and $CV_{ss}$ existing within the integrated circuit containing output buffer 2.

Drive circuit 40 receives as inputs the voltage at node 21 in switching circuit 30, and also the output of NAND gate 16. The output of NAND gate 16 is connected to the gates of a p-channel transistor 34 and an n-channel transistor 36. Transistor 34 has its source connected to $V_{dd}$, and transistor 36 has its source connected to reference node $V_{ss1}$. Reference node $V_{ss1}$ is preferably a reference node separate and electrically isolated from nodes $DV_{ss}$ and $CV_{ss}$, for providing reference potential to the logic in drive circuit 40 (as well as the logic functions of NAND gates 10 and 16, and inverter 18, and other logic elsewhere in the integrated circuit containing output buffer 2). However, separate and isolated reference nodes $V_{ss1}$ and $CV_{ss}$ are not essential to the invention, as reference node $CV_{ss}$ could also serve as the logic reference potential if the level of the noise generated by such logic can be tolerated at output buffer 2. Of course, noise at reference node $CV_{ss}$ in output buffer 2 will be minimized if isolated reference nodes $CV_{ss}$ and $V_{ss1}$ are utilized as shown in FIG. 1.

P-channel transistor 38 has its source-to-drain path connected between the drains of transistors 34 and 36, and has its gate connected to node 21 of switching circuit 30. Drive circuit 40 further includes n-channel transistor 42, which has its source-to-drain path connected in parallel with transistor 36, but which has its gate also connected to node 21 of switching circuit 30. Node 41, at the junction of the drain of p-channel transistor 38 and the drain of n-channel transistors 36 and 42, is connected to the gate of transistor 32.

Figure 2:
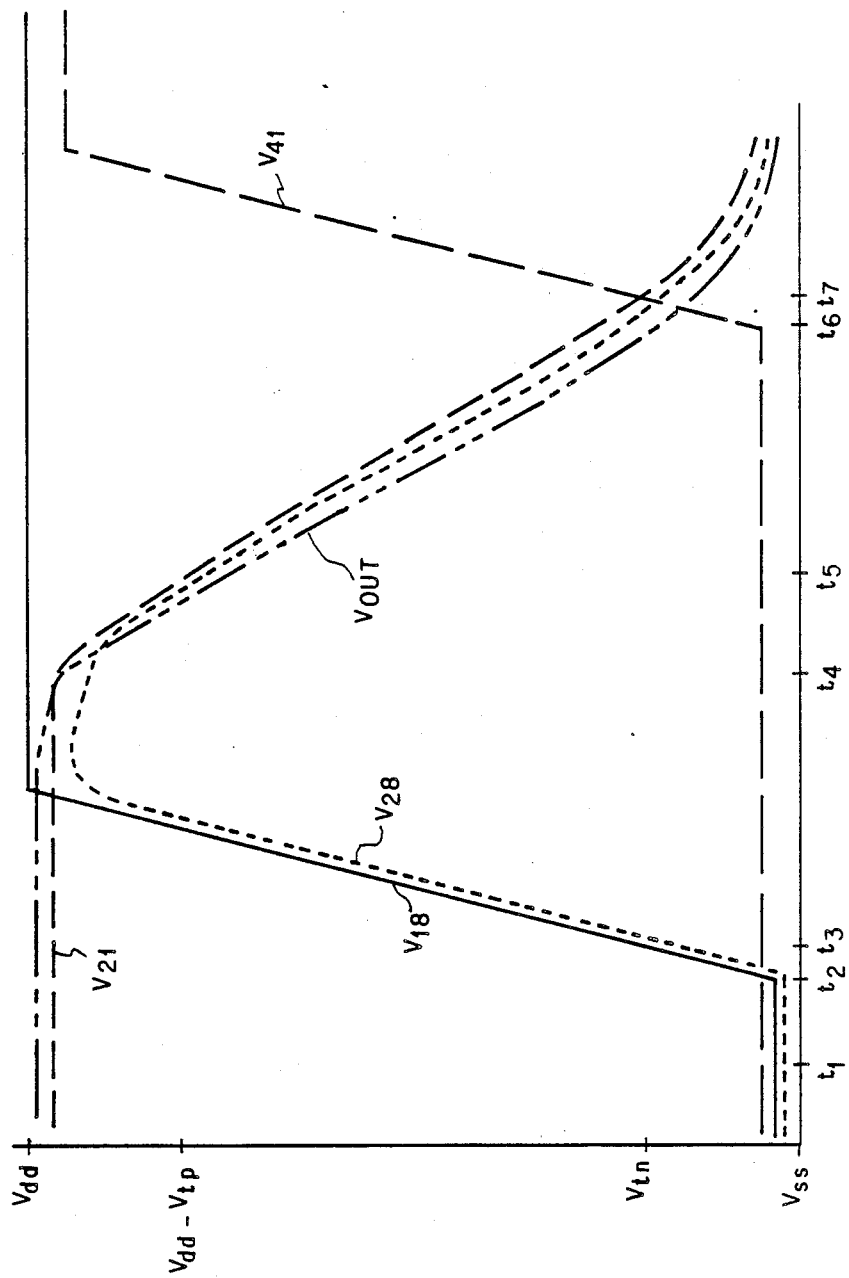
FIG. 2 is a timing diagram illustrating the operation of the circuit of FIG. 1 in effecting a high-to-low transition at the output thereof.

Referring now to FIG. 2, in conjunction with FIG. 1, the operation of output buffer 2 in performing a high-to-low transition at line OUT will be described. This description will begin in the initial condition where line OUT is driven at a high logic level. At this time, shown as $t_1$ on FIG. 2, the voltage at the sources of transistors 22 and 26 will be near $V_{dd}$ (transistor 14 being on) and the output of inverter 18 (shown as $V_{18}$) will be at a low level, since line IN is at a high level. Transistors 22 and 26 will be off due to the output of inverter 18 being low, and transistor 20 will be on which will place a high level at node 21 (shown as $V_{21}$), at the drains of transistors 20 and 22. Transistors 24 is thus turned on, but the drain of transistor 24 is being driven to a low level due to inverter 18. A low level (shown as $V_{28}$ in FIG. 2) is thus presented at the gate of transistor 28.

At time $T_2$, responsive to a transition of line IN from a high to a low level, the output of inverter 18 begins a low-to-high transition. Since transistor 24 is on due to the charging of node 21 to a high voltage prior to this transition of inverter 18 (e.g., at time $t_1$), the voltage at the gate of transistor 28 (i.e., $V_{28}$) will substantially follow the output voltage $V_{18}$ of inverter 18. Once voltage $V_{28}$ reaches $V_{tn}$ (at time $t_3$), transistor 28 begins to turn on, and begins to discharge line OUT to reference node $DV_{ss}$. Transistor 24 is kept in the on state by the action of transistor 22 turning on as voltage $V_{18}$ reaches $V_{tn}$, which connects the high logic level of line OUT to node 21. In addition, transistor 26 will also be turned on by inverter 18 once voltage $V_{18}$ reaches $V_{tn}$, which allows the high level to which line OUT was previously charged to also be applied to the gate of transistor 28.

So long as node 21 remains high (above the level of $V_{dd}-V_{tp}$, where $V_{tp}$ is the threshold voltage of the p-channel transistors in output buffer 2), transistor 38 will remain off. The output of NAND gate 16 at this time is low, turning on transistor 34 and turning off transistor 36. Since transistor 38 is off, and since transistor 42 remains on (so long as node 21 remains above $V_{tn}$) node 41 at the gate of transistor 32 will remain low (shown in FIG. 2 as $V_{41}$), keeping transistor 32 off and keeping reference node $CV_{ss}$ isolated from reference node $DV_{ss}$.

Beginning at time $t_4$, however, the discharge of line OUT to reference node $DV_{ss}$ is beginning to drop the voltage of line OUT (shown as $V_{OUT}$ in FIG. 2). Since transistors 22 and 26 are turned on by inverter 18, voltage $V_{28}$ at the gate of transistor 28 and voltage $V_{21}$ at node 21 will substantially follow voltage $V_{OUT}$ of line OUT. As the voltage of node 21 drops below the level $V_{dd}-V_{tp}$, p-channel transistor 38 in drive circuit 40 will begin to turn on (shown at time $t_5$ of FIG. 2). Node 41 will remain low, however, so long as the voltage $V_{21}$ at node 21 remains above $V_{tn}$. At time $t_6$, the voltage $V_{21}$ reaches $V_{tn}$, which turns off transistor 42, and allows node 41 to be charged to a high logic level. As voltage $V_{41}$ reaches $V_{tn}$, at time $t_7$, transistor 32 begins to turn on, and will bias line OUT from reference node $CV_{ss}$. By this time, however, since the voltage $V_{21}$ has been following the discharging line OUT, the voltage on line OUT has fallen below $V_{tn}$, so that transistor 28 has accomplished substantially all of the discharging of line OUT to reference node $DV_{ss}$. In addition, since the voltage $V_{OUT}$, transistor 28 is off (at time $t_6$) by the time that transistor 32 turns on (time $t_7$). In this way, the action of drive circuit 40 prevents transistor 32 from being turned on until the discharging of line OUT is substantially complete, and indeed until transistor 28 is substantially off. This minimizes the coupling of noise from reference node $DV_{ss}$ to reference node $CV_{ss}$.

The timing of the turning off of transistor 42 with respect to the turning off of transistor 28 can be adjusted by selecting the sizes of transistors 22 and 26. For example, if transistor 26 is made bigger than transistor 22 (e.g., having a W/L ratio twice that of transistor 22), transistor 26 will switch faster than transistor 22. In this way, the gate voltage of transistor 28 may be brought below $V_{tn}$ well before node 21 reaches $V_{tn}$, thereby further assuring that transistors 28 and 32 are not both on at the same time.

The low-to-high transition of line OUT responsive to a low-to-high transition of line IN is accomplished solely through the action of NAND gate 10 and buffer 12 which turns on p-channel pull-up transistor 14. If noise on the rising transition of line OUT were a problem, circuits equivalent to switching circuit 30 and drive circuit 40, in conjunction with a separate supply node having the voltage $V_{dd}$, could be provided in output buffer 2. However, it has been found that the falling transition which couples noise to the reference nodes has generated more problems in modern integrated circuits.

Referring back to FIG. 1, it should be noted that if the initial condition of line OUT were at a low level, transistor 28 will never turn on, since transistor 22 would couple a low voltage from line OUT to the gate of transistor 24, turning it off, and since transistor 26 would be coupling the low voltage of line OUT onto the gate of transistor 28, turning it off. In addition, if output buffer 2 had recently been in its high-impedance state responsive to a low level on line ENABLE, the remaining charge on output line OUT would be quickly discharged through transistor 28 similarly in the case of a high-to-low transition of line OUT.

When multiple output buffers 2 are to be included into a single integrated circuit, for presenting multiple bits of data at approximately the same time (such as for a sixteen-bit output bus), the reference nodes $DV_{ss}$ of the output buffers 2 may be connected together, as may be the reference nodes $CV_{ss}$. Since transistor 28 will not turn on for one of output buffers 2 which remains at a low state, the noise generated by the switching of other output buffers 2 from a high to a low logic state will not couple to line OUT of the output buffer remaining at a low state.

Although the invention has been described with reference to an illustrative embodiment, it is to be understood that this description is by way of example only, and is not intended to be construed in a limiting sense. It is to be further understood that numerous changes in the details of the illustrative embodiment, and additional embodiments of the invention, will be apparent to, and may be made by, persons skilled in the art having reference to this description. In addition, it is to be further understood that those skilled in the art may readily substitute present and furture equivalent components for those described herein, in order to achieve the same result as the illustrative embodiment. It is contemplated that such changes, substitutions and additional embodiments are within the spirit and scope of the invention as hereinafter claimed.

I claim:

1. An output buffer circuit for presenting an output signal at an output node responsive to an input signal at an input node, comprising;

pull-up means, connected between a power supply node and said output node;

a first pull-down transistor, having a source-to-drain path connected between said output node and a first reference node, and having a gate;

switching means, coupled to said input node, to said output node, and to said gate of said first pull-down transistor, for turning on said first pull-down transistor responsive to said input signal being at a first logic state, and for turning off said first pull-down transistor responsive to the voltage of said output node being substantially at the voltage of said first reference node, and having a drive control node;

a second pull-down transistor, having a source-to-drain path connected between said output node and a second reference node, and having a gate; and drive means, having a first input coupled to said input node, a second input coupled to said drive control node of said switching means, and an output coupled to said gate of said second pull-down transistor, for turning on said second pull-down transistor responsive to said first input with said input node being at said first logic state and said second input with the voltage of said output node being substantially at the voltage of said first reference node.

2. The output buffer circuit of claim 1, wherein said pull-up means comprises:
   a pull-up transistor, having a source-to-drain path connected between said supply node and said output node, and having a gate coupled to said input node so that its source-to-drain path is conductive responsive to said input node being at a second logic state.

3. The output buffer circuit of claim 2, further comprising:
   enable logic, connected to said input node and to an enable input node, for communicating the logic state of said input node to the gate of said pull-up transistor, to said switching means and to said drive means responsive to said enable input node being at a first logic state, and for providing a signal corresponding to said input node at said first logic state to said pull-up transistor, and a signal corresponding to said input node at said second logic state to said switching means and to said drive means, responsive to said enable input node being at a second logic state.

4. The output buffer circuit of claim 1, wherein said drive means comprises:
   a reference node;
   a first drive logic transistor, having a source-to-drain path connected between the gate of said second pull-down transistor and said reference node, and having a gate coupled to said first input so that said first drive logic transistor is conductive responsive to said input node being at a second logic state;
   a second drive logic transistor, having its source-to-drain path connected between the gate of said second pull-down transistor and said reference node, and having a gate connected to said second input so that said second drive logic transistor is conductive responsive to the voltage at said output node being substantially above the voltage of said first reference node; and
   drive logic biasing means, connected between said supply node and said gate of said second pull-down transistor, and coupled to said first input so that said gate of said second pull-down transistor is biased from said supply node responsive to said input node being at said first logic state;
   wherein said second pull-down transistor is conductive responsive to its gate voltage being substantially at the voltage of said supply node, and wherein said second pull-down transistor is not conductive responsive to its gate voltage being substantially at the voltage of said reference node.

5. The output buffer of claim 4, wherein said reference node of said drive means is a third reference node, isolated from said first and second reference nodes.

6. The output buffer circuit of claim 1, wherein said switching means comprises:
   biasing means, coupled to said input node, for biasing said gate of said first pull-down transistor to be conductive responsive to said input node being at said first logic state;
   a first switch logic transistor, having its source-to-drain path connected between said output node and said gate of said first pull-down transistor, and having a gate coupled to said input node, for connecting said output node to said gate of said first pull-down transistor responsive to said input node being at said first logic state; and
   a second switch logic transistor, having its source-to-drain path connected between a drive control node and said output node, and having a gate coupled to said input node, for connecting said output node to said drive control node responsive to said input node being at said first logic state;
   wherein said second input of said drive means is coupled to said switching means at said drive control node.

7. The output buffer circuit of claim 6, wherein said drive means comprises:
   a reference node;
   a first drive logic transistor, having a source-to-drain path connected between the gate of said second pull-down transistor and said reference node, and having a gate coupled to said first input so that said first drive logic transistor is conductive responsive to said input node being at a second logic state;
   a second drive logic transistor, having its source-to-drain path connected between the gate of said second pull-down transistor and said reference node, and having a gate connected to said second input so that said second drive logic transistor is conductive responsive to the voltage at said output node being substantially above the voltage of said first reference node; and
   drive logic biasing means, connected between said supply node and said gate of said second pull-down transistor, and coupled to said first input so that said gate of said second pull-down transistor is biased from said supply node responsive to said input node being at said first logic state;
   wherein said second pull-down transistor is conductive responsive to its gate voltage being substantially at the voltage of said supply node, and wherein said second pull-down transistor is not conductive responsive to its gate voltage being substantially at the voltage of said reference node.

8. An output buffer circuit for presenting an output signal at an output node responsive to an input signal at an input node, comprising:
   pull-up means, connected between a power supply node and said output node;
   a first pull-down transistor, having a source-to-drain path connected between said output node and a first ground node, and having a gate, said first pull-down transistor being n-channel;
   switching means, coupled to said input node, to said output node, and to said gate of said first pull-down transistor, for turning on said first pull-down transistor responsive to said input signal being at a first logic state, and for turning off said first pull-down transistor responsive to the voltage of said output node being substantailly at the voltage of said first ground node, and having a drive control node;
   a second pull-down transistor, having a source-to-drain path connected between said output node and a second ground node, and having a gate, said second pull-down transistor being n-channel; and
   drive means, having a first input coupled to said input node, a second input coupled to said drive control node of said switching means, and an output coupled to said gate of said second pull-down transistor, for turning on said second pull-down transistor responsive to said first input with said input node being at said first logic state and said second input with the voltage of said output node being substantially at the voltage of said first ground node.

9. The ouput buffer circuit of claim 8, wherein said pull-up means comprises:
a p-channel pull-up transistor, having a source-to-drain path connected between said supply node and said output node, and having a gate coupled to said input node so that its source-to-drain path is conductive responsive to said input node being at a second logic state.

10. The output buffer circuit of claim 9, further comprising:
enable logic, connected to said input node and to an enable input node, for communicating the logic state of said input node to the gate of said pull-up transistor, to said switching means and to said drive means responsive to said enable input node being at a first logic state, and for providing a signal corresponding to said input node at said first logic state to said pull-up transistor, and a signal corresponding to said input node at said second logic state to said switching means and to said drive means, responsive to said enable input node being at a second logic state.

11. The output buffer circuit of claim 8, wherein said drive means comprises:
a ground;
a first n-channel drive logic transistor, having a source-to-drain path connected between the gate of said second pull-down transistor and said ground node, and having a gate coupled to said first input so that said first drive logic transistor is conductive responsive to said input node being at a second logic state;
a second n-channel drive logic transistor, having its source-to-drain path connected between the gate of said second pull-down transistor and said ground node, and having a gate connected to said second input so that said second drive logic transistor is conductive responsive to the voltage at said output node being substantially above the voltage of said first ground node; and
drive logic biasing means, connected between said supply node and said gate of said second pull-down transistor, and coupled to said first input so that said gate of said second pull-down transistor is biased from said supply node responsive to said input node being at said first logic state and said first and second n-channel drive logic transistors being off.

12. The output buffer of claim 11, wherein said ground node of said drive means is a third ground node, isolated from said first and second ground nodes.

13. The output buffer circuit of claim 8, wherein said switching means comprises:
biasing means, coupled to said input node, for biasing said gate of said first pull-down transistor to be conductive responsive to said input node being at said first logic state;
a first n-channel switch logic transistor, having its source-to-drain path connected between said output node and said gate of said first pull-down transistor, and having a gate coupled to said input node, for connecting said output node to said gate of said first pull-down transistor responsive to said input node being at said first logic state; and
a second n-channel switch logic transistor, having its source-to-drain path connected between a drive control node and said output node, and having a gate coupled to said input node, for connecting said output node to said drive control node responsive to said input node being at said first logic state;
wherein said second input of said drive means is coupled to said switching means at said drive control node.

14. The output buffer circuit of claim 13, wherein said drive means comprises:
a ground;
a first n-channel drive logic transistor, having a source-to-drain path connected between the gate of said second pull-down transistor and said ground node, and having a gate coupled to said first input so that said first drive logic transistor is conductive responsive to said input node being at a second logic state;
a second n-channel drive logic transistor, having its source-to-drain path connected between the gate of said second pull-down transistor and said ground node, and having a gate connected to said second input so that said second drive logic transistor is conductive responsive to the voltage at said output node being substantially above the voltage of said first ground node; and
drive logic biasing means, connected between said supply node and said gate of said second pull-down transistor, and coupled to said first input so that said gate of said second pull-down transistor is biased from said supply node responsive to said input node being at said first logic state and said first and second n-channel drive logic transistors being off.

15. A method for driving an output node to a reference voltage comprising the steps of:
receiving an input signal;
responsive to receiving said input signal at a first logic state, turning on a first pull-down transistor having its source-to-drain path connected between said output node and a first reference node and generating a voltage at said output node;
turning off said first pull-down transistor responsive to said voltage of said output node approaching the voltage of said first reference node; and
after the step of turning on said first pull-down transistor, and responsive to the voltage of said output node approaching the voltage of said first reference node, turning on a second pull-down transistor having its source-to-drain path connected between said output node and a second reference node.

16. The method of claim 14, wherein the step of turning off said first pull-down transistor comprises:
connecting the gate of said first pull-down transistor to said output node, so that the voltage at the gate of said first pull-down transistor follows the voltage of said output node.

17. The method of claim 14, wherein the step of turning on said second pull-down transistor comprises:
turning off a discharge transistor which has its source-to-drain path connected between the gate of said second pull-down transistor and a reference node; and
turning on a charging transistor which has its source-to-drain path connected between the gate of said second pull-down transistor and a supply node.

* * * * *